United States Patent [19]

Thayer et al.

[11] Patent Number: 5,117,963
[45] Date of Patent: Jun. 2, 1992

[54] SYSTEM FOR AUTOMATED HANDLING OF SYMMETRICAL SUPPLY TUBES

[75] Inventors: Glenn S. Thayer; William C. Layer, both of Boise, Id.

[73] Assignee: Micron Technology, Inc., Boise, Id.

[21] Appl. No.: 626,924

[22] Filed: Dec. 12, 1990

[51] Int. Cl.⁵ ............................................. B65G 47/24
[52] U.S. Cl. .................... 198/395; 198/400; 198/417
[58] Field of Search ............... 198/400, 376, 395, 417

[56] References Cited

U.S. PATENT DOCUMENTS

| | | |
|---|---|---|
| 3,710,924 | 1/1973 | Schultz ............... 198/400 X |
| 3,828,921 | 8/1974 | Tackett ............... 198/400 X |
| 3,896,935 | 7/1975 | Hjelle et al. . |
| 3,899,085 | 8/1975 | Chaparro et al. . |
| 4,500,246 | 2/1985 | Janisiewicz et al. . |
| 4,618,305 | 10/1986 | Cedrone et al. . |
| 4,629,387 | 12/1986 | Stillman et al. . |
| 4,647,269 | 3/1987 | Wedel et al. . |
| 4,761,106 | 8/1988 | Brown et al. . |
| 4,763,811 | 8/1988 | Mae et al. . |
| 4,775,280 | 10/1988 | Kelley . |
| 4,778,063 | 10/1988 | Ueberreiter . |
| 4,782,939 | 11/1988 | Fields ............... 198/417 X |
| 4,850,785 | 7/1989 | Machado . |
| 4,862,578 | 9/1989 | Holcomb . |
| 4,878,801 | 11/1989 | Pearson . |

*Primary Examiner*—D. Glenn Dayoan
*Attorney, Agent, or Firm*—Stanley N. Protigal

[57] ABSTRACT

The inventive apparatus automatically processes symmetrical supply tubes used in the storage and handling of semiconductor integrated circuit packages, IC. Unlike prior art methods which rely on the asymmetrical quality of the A-tube, the invention processes symmetrical, rectangular tubes to a point where the contents are discharged to a desired orientation. The invention operates to manipulate the symmetrical supply tubes from a gravity bin to a standing position wherein each tube is at rest on one of its two narrow sides. The tubes are then singulated, moved, and tilted to a position where the leading ICs are discharged to a short distance outside the tube. The IC are held on side in either a lead left or lead right position and are sensed to determine their orientation. Upon determination of the lead left or lead right orientation, the sort block is appropriately placed and the IC are released. The IC are reoriented as they stream through one of two geometrically shaped voids of the sort block onto a part track.

34 Claims, 14 Drawing Sheets

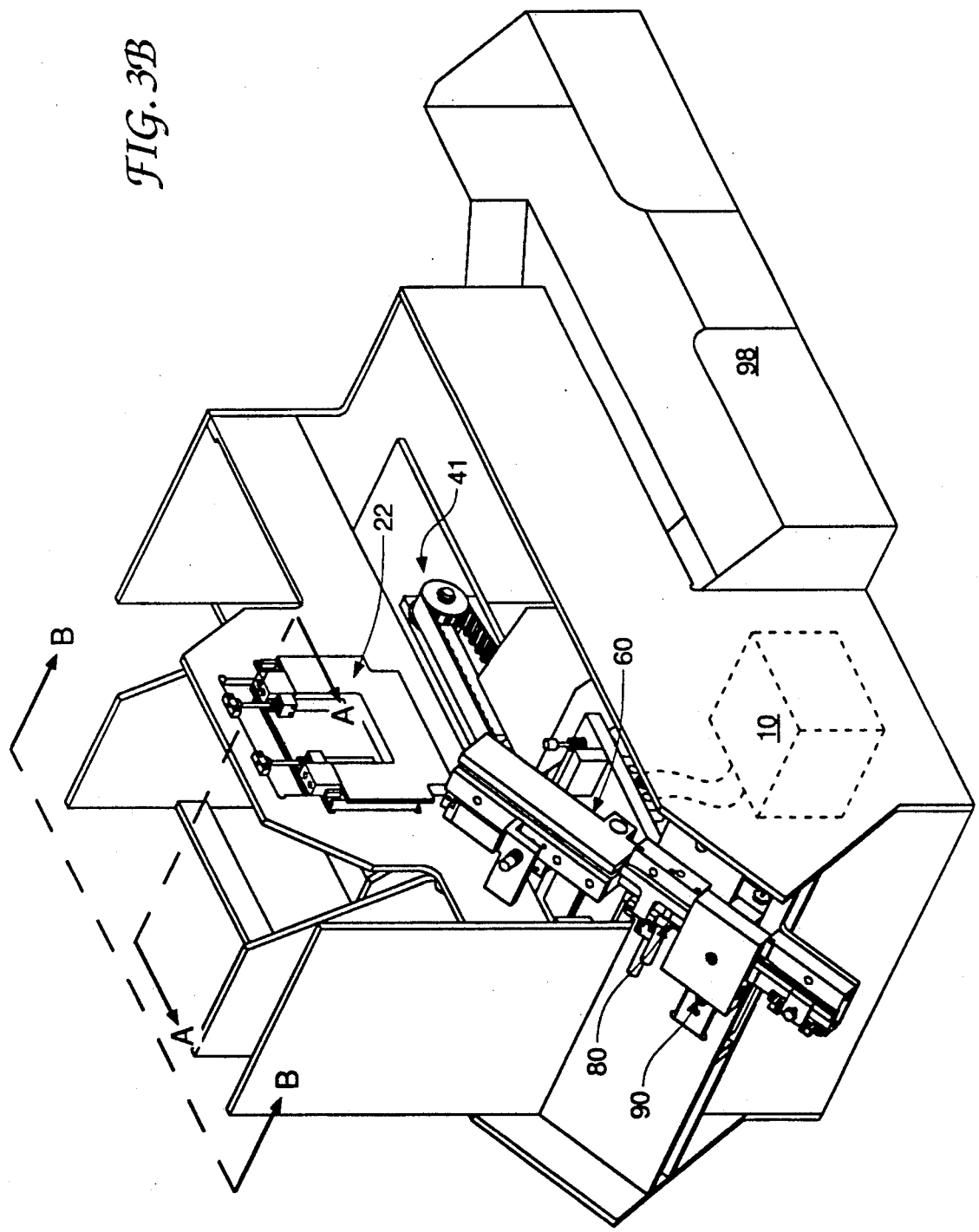

SYSTEM FOR AUTOMATED HANDLING OF SYMMETRICAL SUPPLY TUBES

BACKGROUND OF THE INVENTION

This invention relates to a system for the automated handling of semiconductor integrated circuit packages from supply tubes used in the transportation and storage of the integrated circuit packages. The invention particularly relates to the receiving, orienting and movement of symmetrical supply tubes and the subsequent discharge of integrated circuits packages from those tubes into a selected position and orientation.

2. Description of the Prior Art

Semiconductor integrated circuit packages (hereinafter referred to as integrated circuits or IC) present an unusual packaging and handling situation because of their small size, fragile nature, and, often, large quantity. Their inception created a need for a package to facilitate the transfer and handling of large numbers of IC between manufacturing and testing processes and, ultimately, for storage and shipment to their place of use. The development of the hollow IC supply tubes (also known as magazines, carriers, and sticks) was in direct response to that need. The tubes are available in various constructions but generally are manufactured of extruded plastic in an open-ended form approximating the shape of the workpiece to be contained within. The tubes effectively protect the IC, facilitate their inventory, and preserve a desired alignment of the IC for subsequent processing. They are universally used in the handling, shipping, and storage of IC. The adoption of the tubes as the vehicle of choice for IC has created a subsequent need for machinery to facilitate the handling of the tubes.

The dual in-line package, or DIP, shown in FIG. 1A has historically been the most popular and widely produced IC. DIPs are generally rectangular in body with thin, rather fragile leads extending from the body a sufficient distance to be plugged into a circuit board. The A-tube shown in FIG. 1B was developed specifically to accommodate the unique character of the DIPs. The A-tube is shaped like the perimeter of an "A" in that it is narrower at its flat peak than at its base with sides sloping outwardly from peak to base. The interior void of the "A" is shaped to closely conform to the shape of the DIP in a manner which distributes the weight of an individual IC, or a line of ICs, upon the DIP body rather than upon the bendable leads whether in the upright "live bug", inverted "dead bug", or on-end position.

A variety of factors including the commercial importance of the DIP and the competitiveness of the IC market operated to make the A-tube the focus of industry efforts to automate the handling of ICs. However, it is the asymmetrical shape of the A-tube itself which has enabled mechanical manipulation of a storage tube in such a way that it could be reoriented with certainty and consistency and its contents could subsequently be discharged in a preselected alignment. The external configuration of the A-tube both reflects the orientation of the chips within and facilitates the mechanical selection of a particular orientation of the tube.

Prior art has employed many different approaches to achieving a specific rotational position of A-tubes. One method rotates a drum through a bin of agitated A-tubes and singulates the tubes into an indexed position by thus urging the tubes into narrow slots on the drum which will accept only the peak sides of the A-tubes. Another method reorients A-tubes by floating them on jets of air where the tubes will seek a certain position as a result of their center of gravity. Another method singulates the tubes to any rotation and then individually turns them through a break beam sensor to determine the desired rotation. All the methods available in prior art rely on the asymmetrical shape of the supply tube to index the tube for automated handling. An automated system for handling irregularly shaped tubes is disclosed in U.S. Pat. No. 4,878,801.

Many IC packages developed more recently than the DIP do not share its unique shape. Single in-line package, SIP, and zigzag in-line package, ZIP, provide plug-in length leads which extend from a single side of the package. Small outline J-bend, SOJ, such as shown in FIG. 2A and plastic leaded chip carrier, PLCC, provide shorter leads which are bent back against the body of the package and are surface mounted rather than plugged into a socket. Leadless chip carrier, LCC, style packages have no lead extensions but, instead, provide sockets whereby they may be connected to a circuit board. A wide variety of other styles of packages exist which provide their own specific advantages and characteristics.

The more recently developed surface-mount technology, SMT, packages (for example the SOJ, PLCC, and LCC) are generally more symmetrically shaped than the DIP and without fragile extended leads. Packages such as the SOJ, the PLCC, and the LCC have relatively shortened or no leads. An asymmetrical tube is neither necessary nor desireable for these chips. Their symmetrical tubes, however, pose a sensing and handling problem. "Symmetrical tube" in this context is used to mean a rectangular tube, similar on two opposing sides (refer FIG. 2B). Where the interior articles are oriented in a particular manner, the tube is the same to devices sensing the outside of the tube. For example, a symmetrical tube standing on either side, full of SOJ chips uniformly in line, would have the SOJ leads facing either left or right. Unlike the asymmetrical A-tube, symmetrical tubes in themselves are not outwardly distinguishable as to either of two sides nor are they susceptible to mechanical urging to a particular position.

The inventive device enables automatic handling of symmetrical IC supply tubes such that articles contained within may be discharged in a desired orientation. The principal distinction over prior art is the ability to automatically sense and reorient the IC without dependence on a unique quality of the supply tube.

SUMMARY OF THE INVENTION

The invention provides an automated means for handling elongated, hollow supply tubes such as the type used in the handling of IC devices in such a manner that the workpieces contained within can be automatically discharged into a desired, predetermined position. More importantly, the invention provides means for the automated handling of symmetrical, rectangular supply tubes. The new and innovative feature of the invention lies in its total lack of dependence on any special indexing feature or asymmetrical shape of the supply tube.

Where automation processes of prior art relied upon the unique shape of the A-tube to indicate the orientation of the contents within, the inventive device requires of the symmetrical tube only that it be generally rectangular, open at its downstream end, and received into the machine in a matching downstream orientation. The method requires also that the leads of all the ICs within a tube be similarly oriented so that all the leads (or lead receptacles in a LCC) face the same side of the tube. In a side-lying tube resting on its minor axis as in the preferred embodiment, the leads will face all left or all right. It is obvious that the method is adaptable to an arrangement in which the tubes are flat lying and the workpieces within would be determined to all be in either the dead bug or live bug position.

The inventive apparatus operates to process symmetrical IC supply tubes from a gravity bin to a standing position wherein each tube is at rest on one of its two narrow sides so that the workpieces within can only be orientated in one of two attitudes. Once so positioned, the tubes are singulated, moved, and tilted to a position where the leading IC is gravitationally discharged to a short distance outside the tube. The leading IC is there restrained and sensed. Upon determination of the lead left or lead right orientation, the sort block is appropriately placed and the IC are released. The IC are reoriented as they stream through the geometrically shaped void of the sort block onto a part track and are, thus, rolled to the desired, predetermined position.

BRIEF DESCRIPTION OF THE DRAWINGS

FIG. 3B is an isometric view of the front and downstream faces of the machine in which the shuttle assembly is extended both horizontally and vertically. Sections A—A and B—B of FIG. 3B are references to FIGS. 5 and 6, respectively.

DESCRIPTION OF THE PREFERRED EMBODIMENT

The terms "IC" is used to mean semiconductor integrated circuit packages and types of IC such as SOJ, PLCC, DIP and LCC are offered here for purposes of instruction and demonstration but not as a limitation. IC is intended in this context to be exemplary of a workpiece amenable to the inventive method. The following description is of an embodiment particularly suited to surface-mount technology packages such as the SOJ and PLCC but the method is not limited to those packages nor even to IC. Rather, it is conducive to any workpiece containable within a symmetrical supply tube of the type commonly used in the manufacture of IC.

Figure 2A:
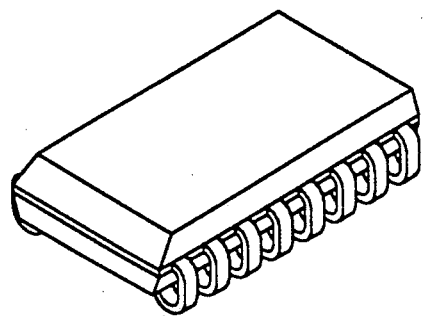
FIG. 2A is a view of a typical surface mount "small outline J-bend", SOJ, package.
Figure 2B:
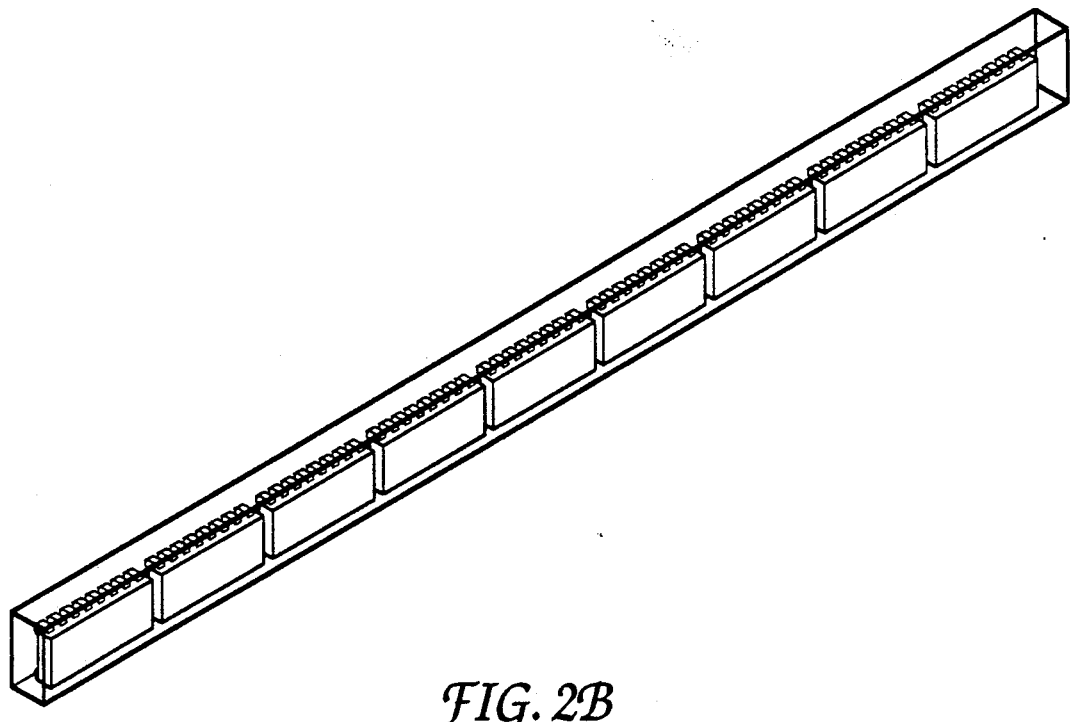
FIG. 2B is a view of a symmetrical supply tube containing SOJ packages. The tube and SOJ workpieces within it are oriented on edge in the "narrow axis" position.

A "symmetrical" or "rectangular" tube (FIG. 2B) is one in which two of the three axis of the tube are in a rectangular relationship to each other. For example, if Z is the length of the tube, normally 50 to 75 centimeters, then the X cross-sectional axis of the tube may be its narrowest dimension and is referred to throughout this text as the narrow axis and/or the narrow width. The Y cross-sectional axis would be something larger than X but very much smaller than Z. The Y axis is referred to throughout this text as the wide axis and/or the wide width. Generally, in the case of SOJ IC supply tubes, for example, the X dimension will be sufficiently larger than the width of the flat lying IC that it fits narrowly but loosely within and the Y dimension will be similarly larger than the height of the flat lying SOJ IC.

Figure 3A:
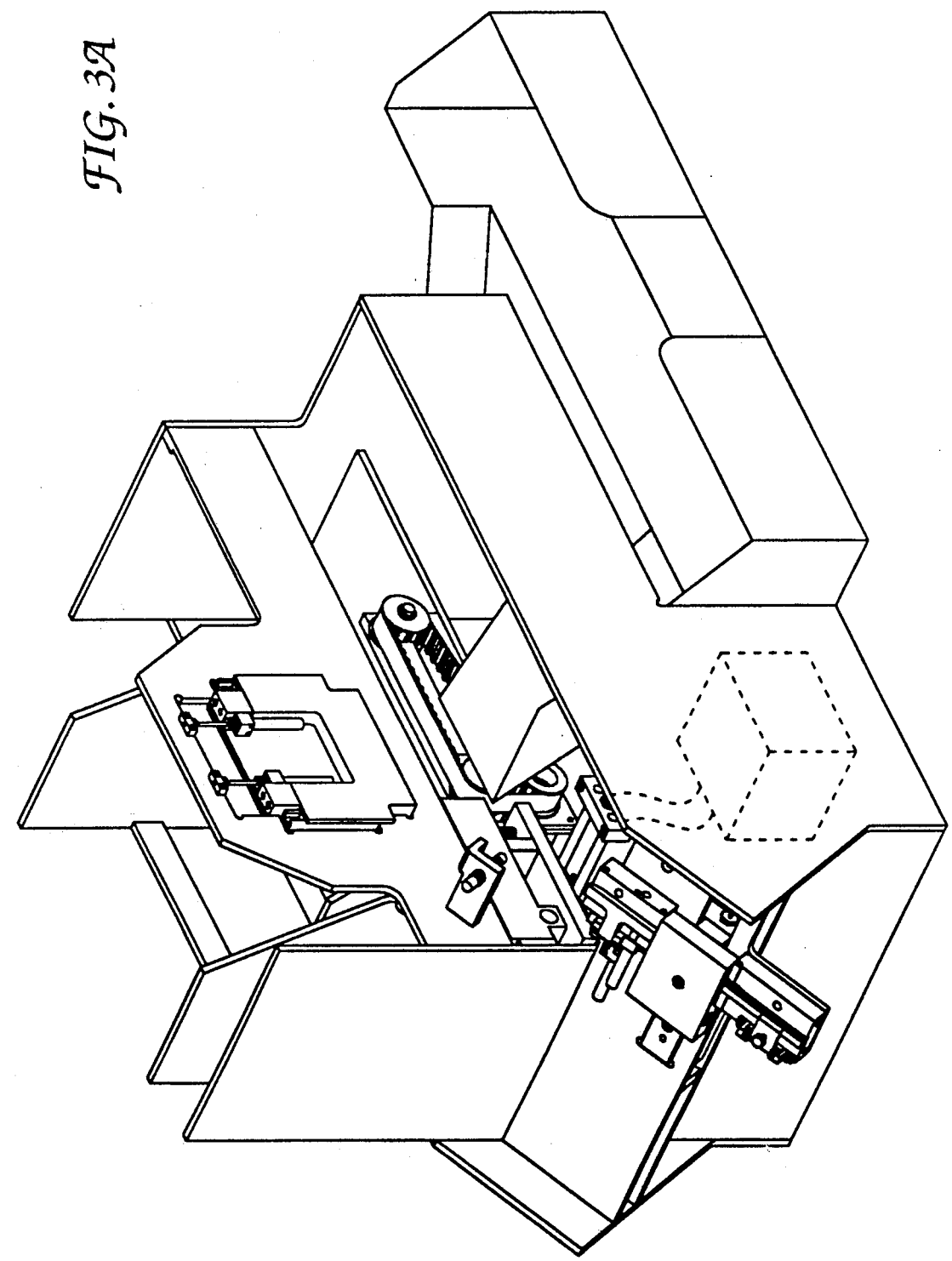
FIG. 3A is an isometric view of the front and downstream faces of the machine in which the shuttle assembly is in the "home" position.
Figure 4A:
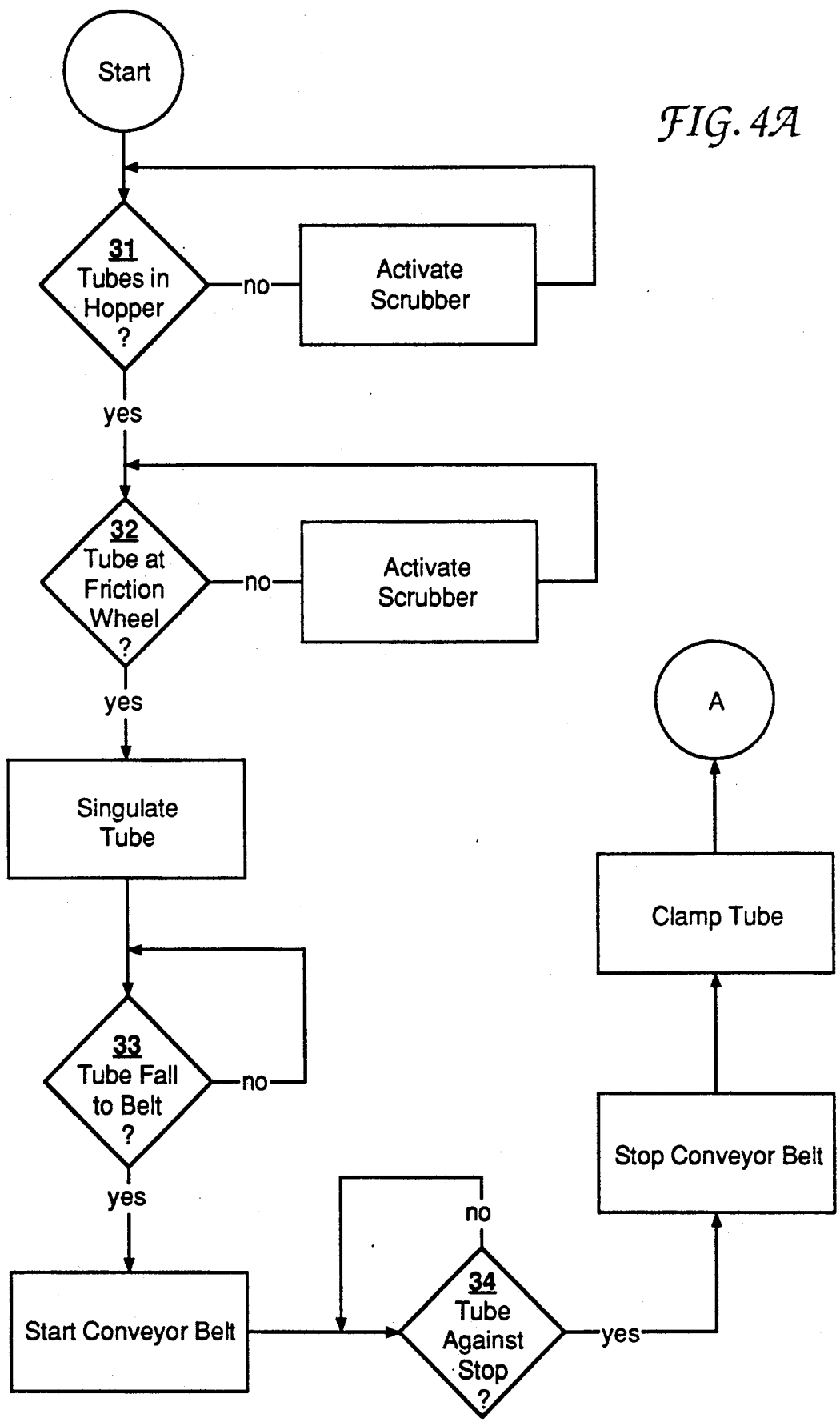
FIGS. 4A, 4B, 4C, and 4D together comprise a flow diagram of the operating routines performed by the inventive device in which a circle represents a starting or continuing point, a square represents a yes or no decision event, and a rectangle represents an activity.
Figure 4B:
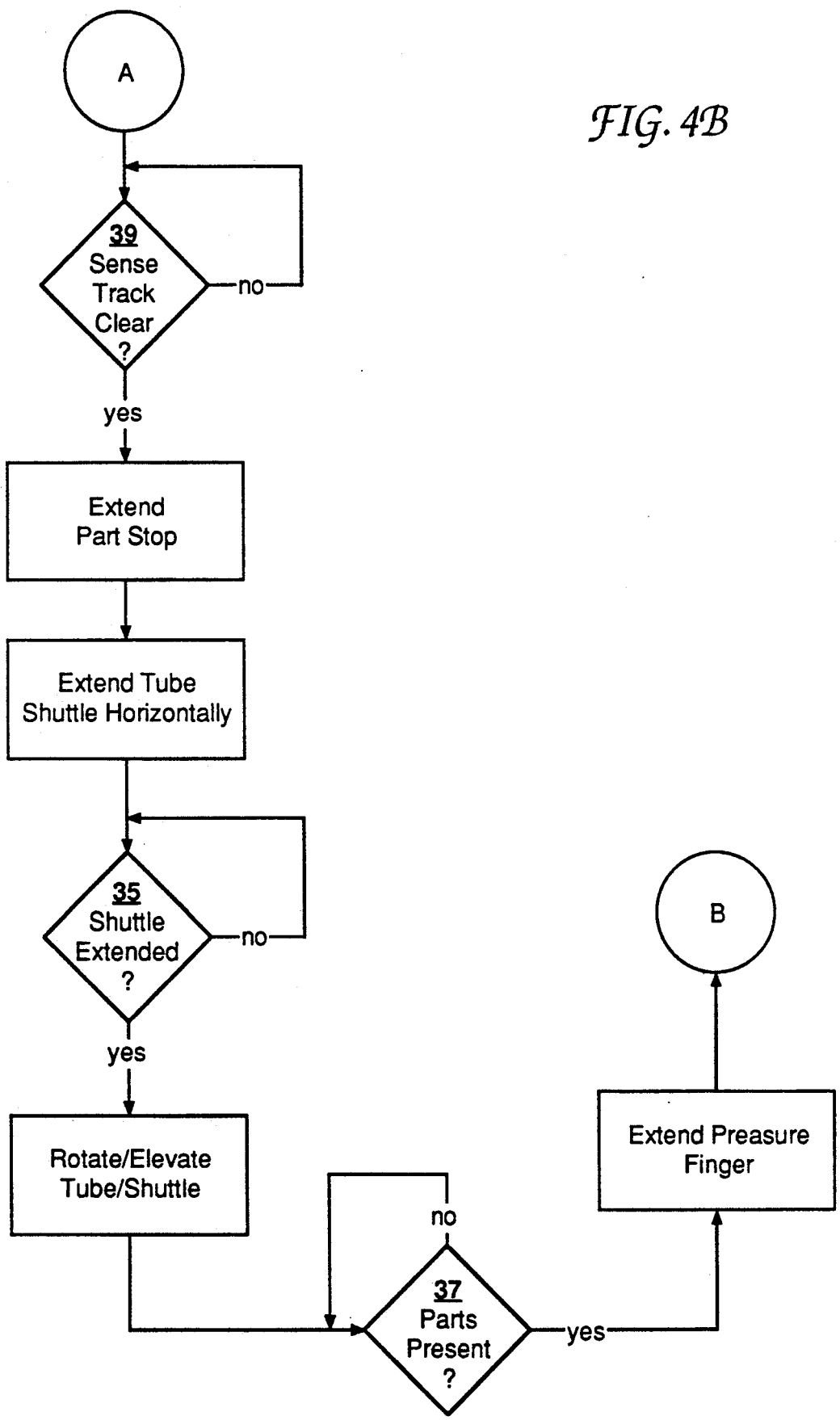
Figure 4C:
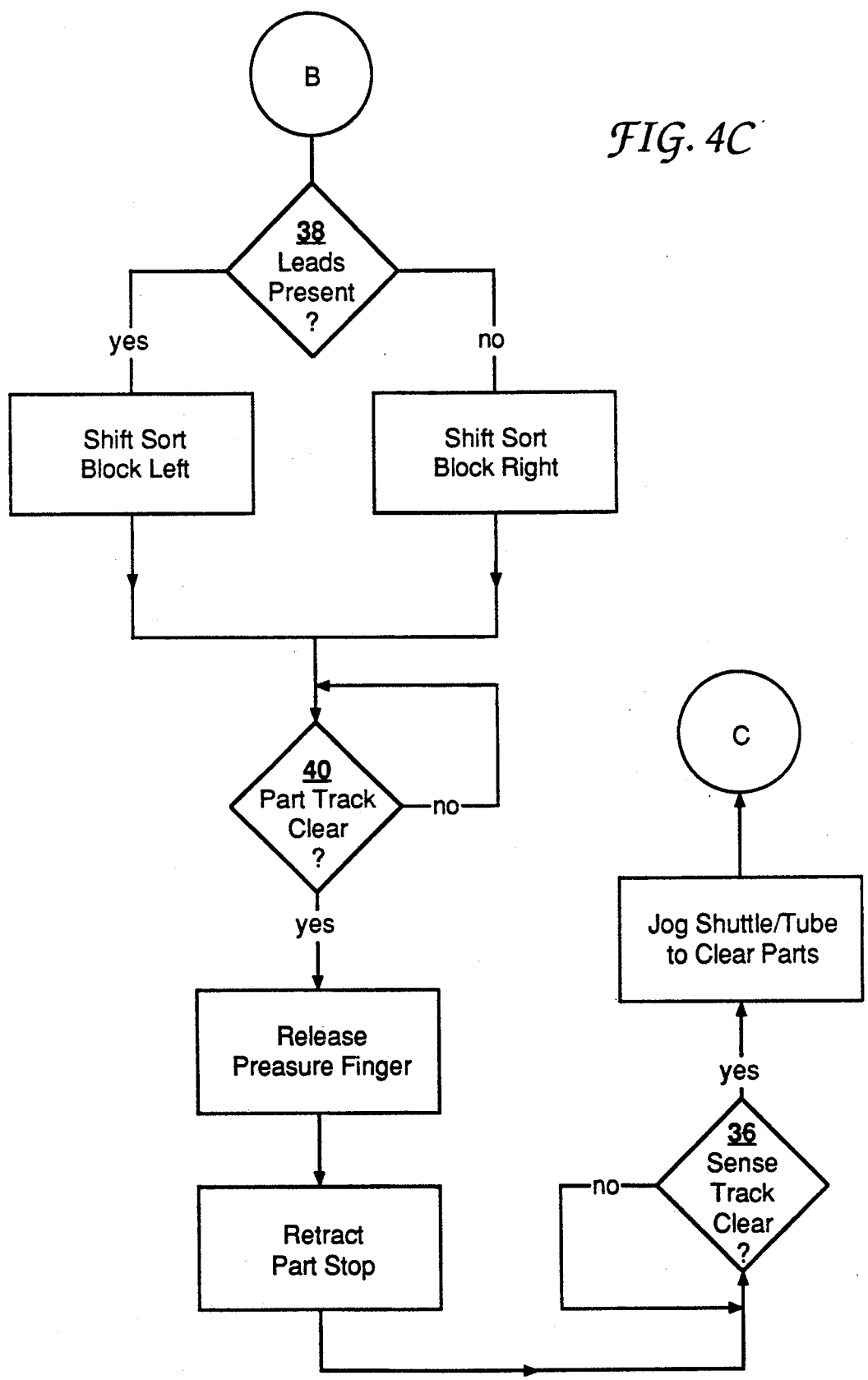
Figure 4D:
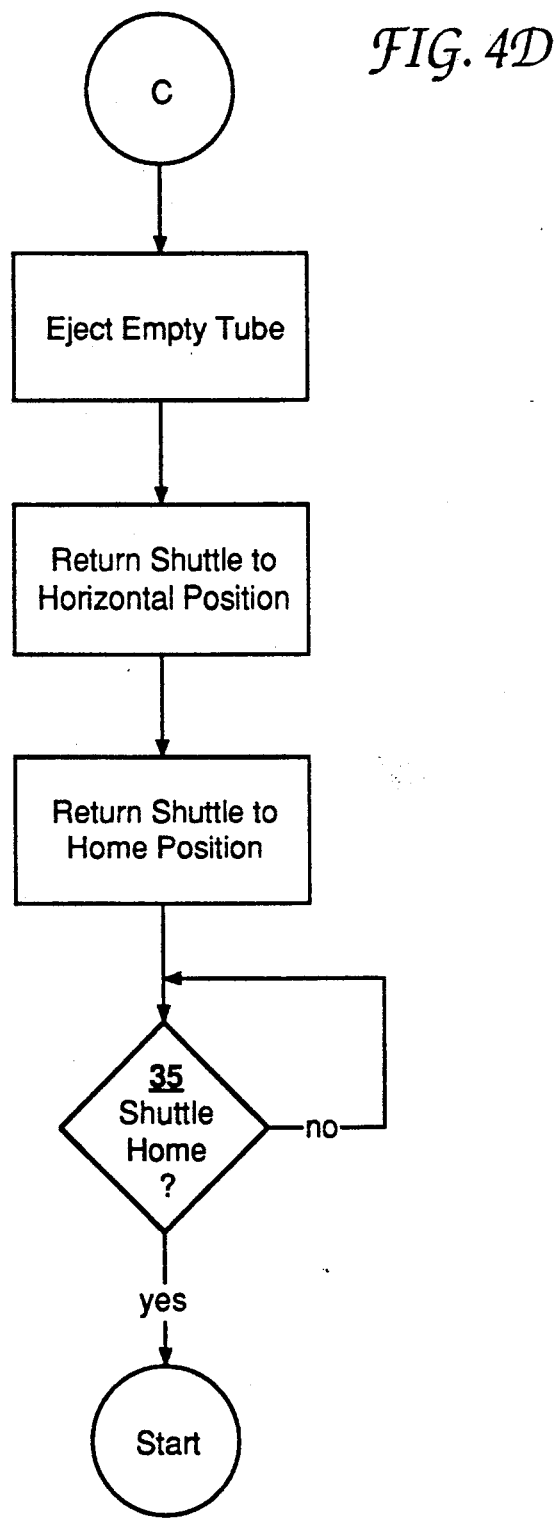

An overall view of the inventive device is shown in FIG. 3A and FIG. 3B. The enabling description of the invention will proceed in the order in which the supply tubes and the workpieces within are treated by the invention; that is, from upstream input of tubes to the downstream discharge of the IC. The operations flow chart, FIGS. 4A–4D, is representative of that order and of the logic scheme applied by the system of microcontroller and sensors within the invention which control its operation. An embedded controller 10 based on the Intel 8096 and proprietary software has been demonstrated to effectively operate the invention. The Intel 8096 microcontroller is known to practitioners of this art as are the various sensors described below.

Figure 5:
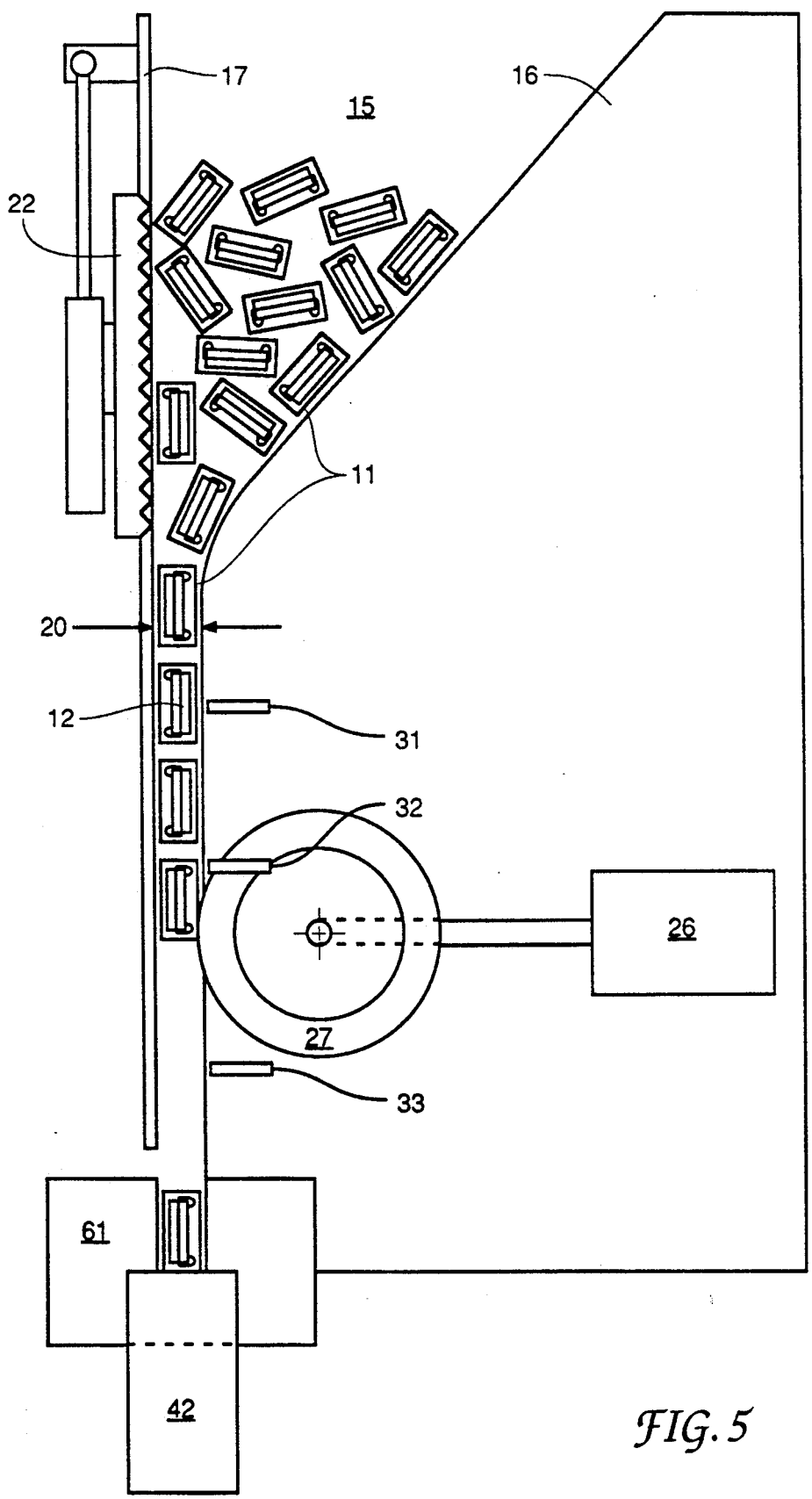
FIG. 5 is a cross section taken through section A—A of FIG. 3B inside the upstream containment wall looking downstream at the gravity bin, the singulation reservoir, and the vibratory scrubber.

Referring to FIG. 5, supply tubes 11 containing workpieces 12 are initially input, open end downstream, into a gravity bin 15. The tubes amenable to this method are, as described above, symmetrical tubes in which opposing sides are the same dimension but are not the same as adjacent sides. The tubes are usually, but not necessarily, formed of extruded plastic.

Figure 6:
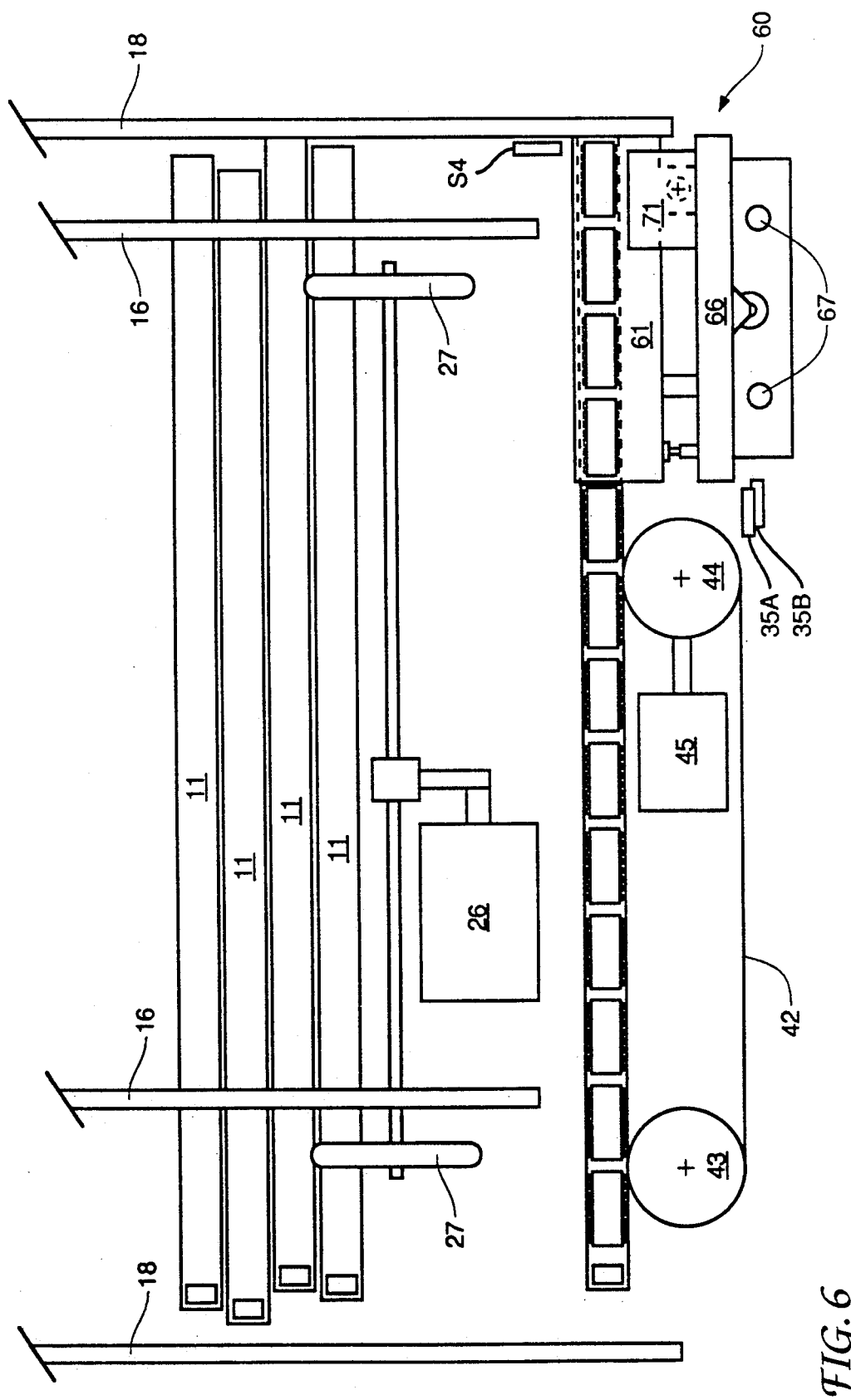
FIG. 6 is a back view of the machine taken through section B—B of FIG. 3B and depicting the singulation wheels and motor, the belt drive mechanism, and the shuttle assembly.

Referring to FIGS. 5 and 6, the gravity bin 15 is the area bordered on one side by two angularly sloping guide plates 16 and, on the opposing side, by a scrubber wall 17. End walls 18 contain the ends of the tubes. See FIG. 6. Immediately below the gravity bin 15 is the singulation reservoir 20, the area bounded by the scrubber wall 17 and the vertical sections of the two guide plates 16. The singulation reservoir 20 is configured to allow entry only on the narrowest side of the tubes. Consequently, IC 12 within the tubes 11 can be oriented only on their narrow sides and can be facing only left or right. The guide plates 16 are readily adjustable to accommodate various widths of tubes 11.

On initiation of "start" (refer flow sheet, FIG. 4A), a sensor 31 will sense the singulation reservoir 20 and determine whether or not a tube 11 is present. Sensor 31 is a photoreflective sensor such as the Omron E3CDM2R. Throughout the system ten sensors, 31 through 40, of various types operate to provide yes or no information to the controller. If sensor 31 senses nothing, a vibratory scrubber 22 will be activated to urge tubes 11 into the reservoir slot 20. Vibratory scrubbers 22 are well known in the art. FIG. 5 illustrates a scrubber 22 constructed of an aluminum plate and conductive pad mounted on ball-bearing slides against the scrubber wall 17 and driven by pneumatic cylinders. Clippard SDR-05 air cylinders have been demonstrated to perform this function effectively. If sensor 31 is blocked, it is indicative that tubes are stacked and ready for singulation. Singulation is defined as the mechanical process in which a plurality of objects (here, the supply tubes 11) is treated to separate and remove a single one of the objects for a subsequent purpose.

Sensors 32 and 33 are dedicated to singulation of tubes Both are photoreflective sensors similar to sensor 31. Sensor 32 functions to further assure the presence of a tube in the ready position for singulation. If a tube 11 is present, no action will be initiated. But if a tube is not present, that signal from sensor 32 will cause the controller 10 to initiate scrubbing until either sensor 32 is blocked by a tube 11 or, after a set time, absence of a signal will result in the call of a "jam." A jam call results whenever certain sensors are not satisfied in whatever it is they seek and a certain period of time has elapsed. The controller 10 will then activate an alarm.

The controller 10, upon receiving a "start" signal from sensor 35A, will initiate rotation of the singulation wheels 27. Stepper motors such as the Compumotor PK2-57-51 are well known in the art and widely used in conjunction with microcontrollers controller 10, and sensor 33 co-operate to drive the friction wheels 27 in a rapid, continuous sequence in which the system looks to see if the tube has passed sensor 33 and steps the motor 26 an incremental distance before looking again and stepping again. The stepping process and rotation will continue until the controller receives a signal from sensor 33 that a tube has fallen whereupon the controller 10 will cease the stepping process until the cycle is run and another tube 11 is required. It is an innovation of this method that a supply tube 11 is singulated without regard to or dependence upon the wide width of the tube. The stepping and sensing process simply continues until the singulation is effected.

The same signal from sensor 33 which stops the singulation process also causes the controller 10 to initiate stepping of the belt drive 42. The singulated tube 11 will fall a short distance, something greater than one of its long widths, to land simultaneously upon the belt drive 42 at the upstream end and the shuttle grip track 44 at the downstream end (refer FIG. 6). The moving belt 42 urges the tube 11 to the end wall 18 where its presence is detected by sensor 34. The belt drive assembly 41 consists essentially of a loop of belt material 42 wrapped around a pulley 43 and a drive wheel 44 which is driven by a stepper motor 45 with the result of the top of the belt 42 moving toward&he downstream end wall 18. The stepper motor 45, controller 10, and sensor 34 co-operate to drive the belt 42 and, consequently the tube 11, in incremental but continuous steps until the tube's presence is sensed. Upon that signal from sensor 34, the controller 10 will (1) stop initiating steps of the belt drive 42 and (2) initiate the grasp of the tube within the grip block 61.

Figure 7:
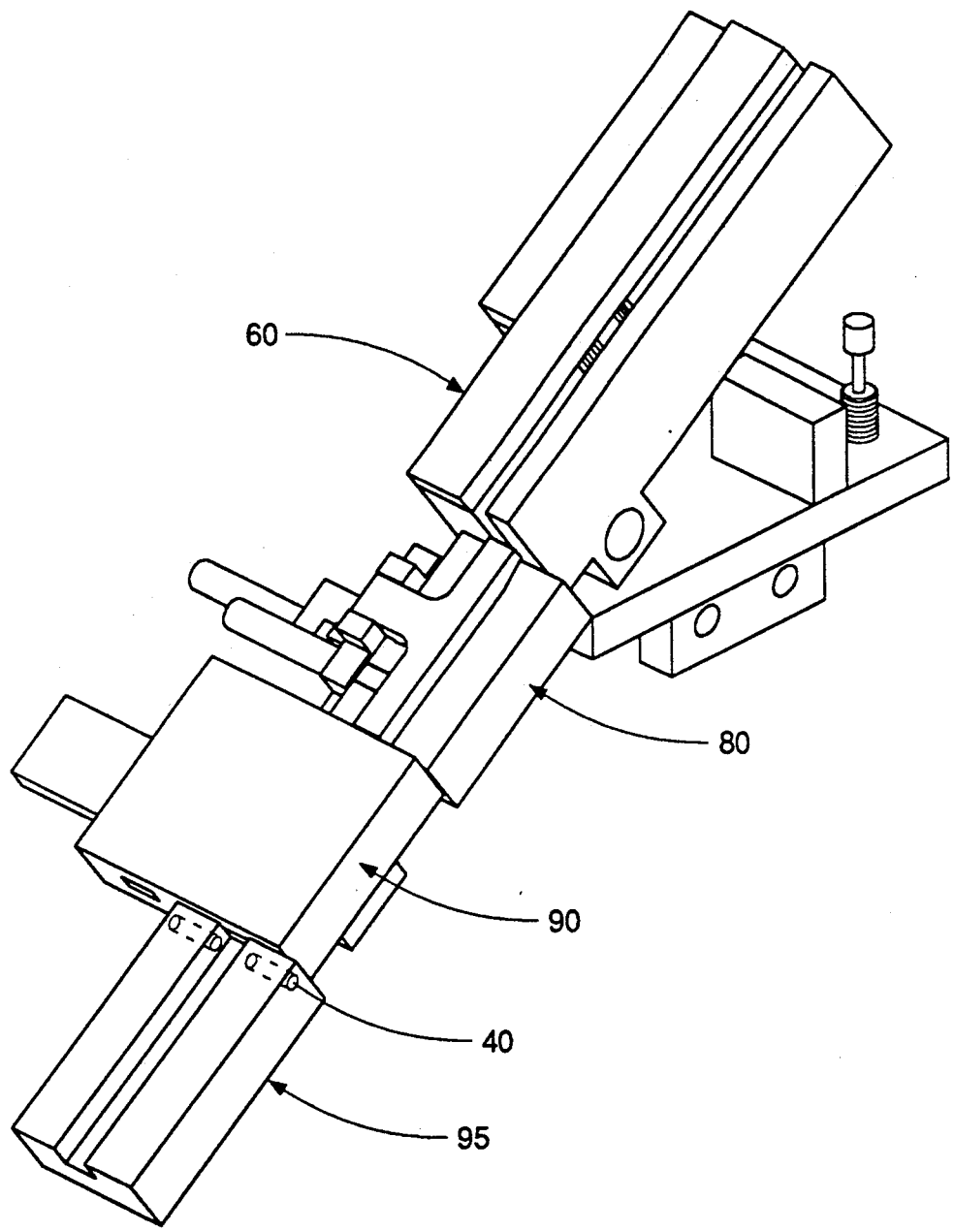
FIG. 7 is an isometric view of the shuttle assembly, the sense block, the sort block, and the exit parts track in the tube discharge position.
Figure 8:
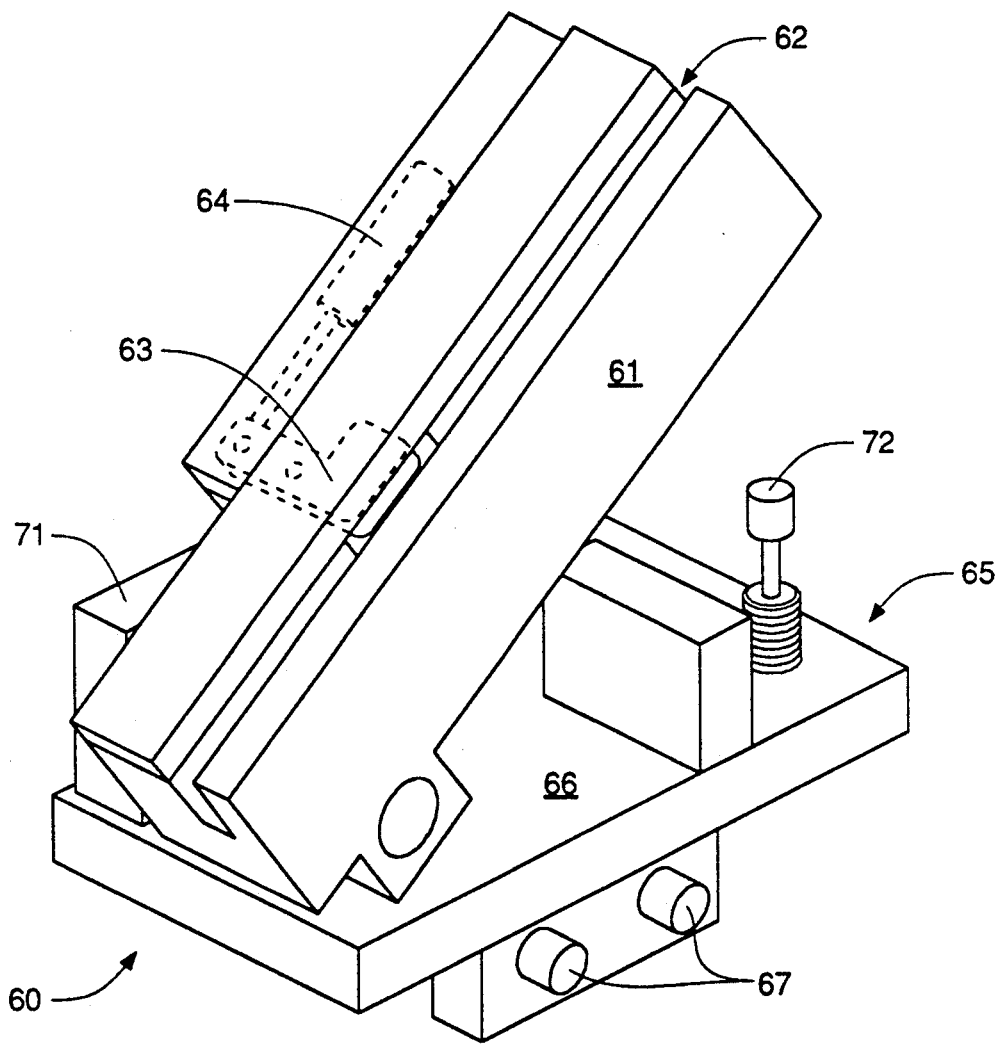
FIG. 8 is an isometric view of the shuttle assembly in the elevated position. Hidden lines depict the grip cam and pneumatic cylinder.

Referring to FIGS. 6, 7, and 8, the collective shuttle assembly 60 consists of three parts: a grip block 61 for holding a tube, a horizontal slide shuttle 65 for moving the tube horizontally, and a vertical rotator 71 for elevating the tube.

The grip block 61 operates to receive a singulated tube 11, hold it, and then timely release the tube when emptied of its contents. It consists of a shaped block 61 with a slot 62 formed in its top for receiving a tube 11, a cam 63 for gripping the tube, and a pneumatic cylinder 64 for driving the cam 63.

The horizontal slide 65 operates to move the whole shuttle assembly 60 horizontally from a position in alignment with the singulation track to a position aligned in the same vertical plane with the discharge tracks. The slide shuttle 65 collectively consists of a base plate 66, a pair of tracks 67 upon which the assembly 60 slides horizontally, a pneumatic cylinder 68 to drive the slide shuttle, and sensors 35A and 35B for detecting the slide shuttle in its home and extended positions. Sensors 35A and 35B are contact sensors which are activated either upon contact of the slide shuttle 65 extension apparatus to a contact at the "home" position (35A) or to a contact at the fully extended position (35B). A suitable component shuttle is the Kosma Slide Unit Model SUT 16. The horizontal slide further functions as a platform from which the grip block 61 may be rotated about a hinge 69 and, thus, elevated by the vertical rotator 71.

The vertical rotator 71 operates to rotate the grip block 61 such that the upstream end of the tube 11 is elevated and the workpieces 12 within are gravitationally discharged. The Compact 022-111-08 rotary cylinder is suitable for this application. Hydraulic bumpers 72 and 73 limit and damp the action of the rotator at its top and bottommost positions.

Upon grasping the tube 11, the controller 10 looks ahead to downstream conditions to determine if they are in order to receive the IC 12 which are imminently to be discharged from the tube. The sense block 80 is the accumulation of a shaped block 81 with a slot, the sense track, 82 formed to receive the IC 12, a part stop 83 to contain the discharged workpieces, a pressure finger 84 to position a workpiece for sensing, and a plurality of sensors 36 through 39). It functions to contain the IC 12 and sense their presence (or absence) and orientation. By looking ahead to sensor 39 the controller 10 determines whether parts 12 remain there or whether it is clear for the shuttle tube 11 to be emptied. If sensor 39 signals parts are present it will continue to "look" until either the track 82 is clear or time elapses to signal an alarm. When sensor 39 detects the sense track 82 is clear, the controller 10 will (1) extend the part stop 83 and (2) horizontally extend the shuttle 60. The part stop 82 is driven by an air cylinder such as the Clippard SDR-05 of the vibratory scrubber 22.

Figure 9A:
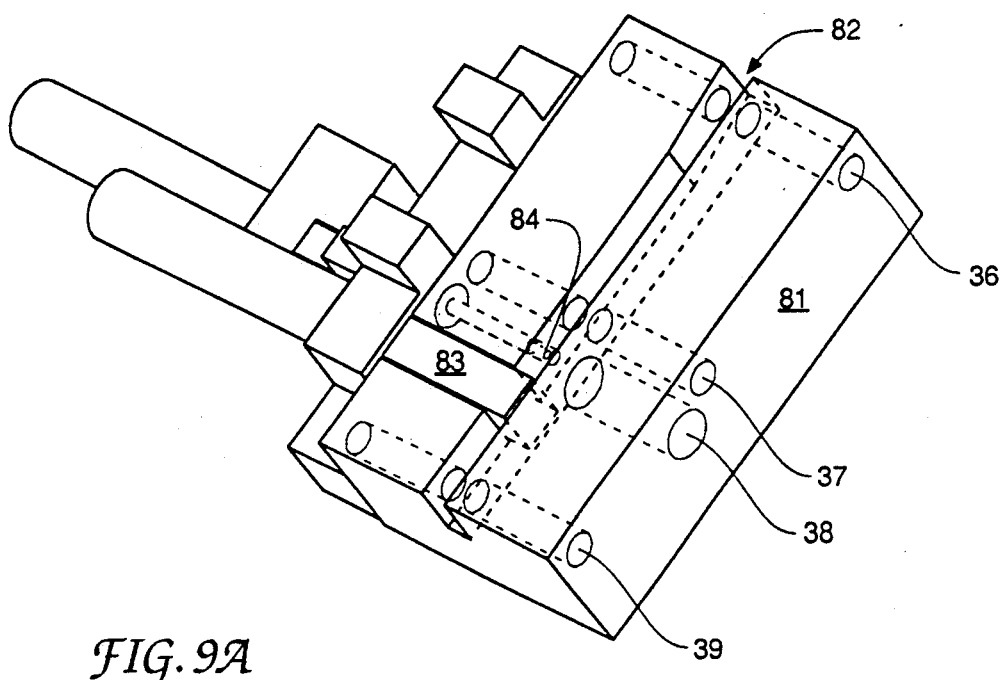
FIG. 9A is a detailed isometric view of the sense block.
Figure 9B:
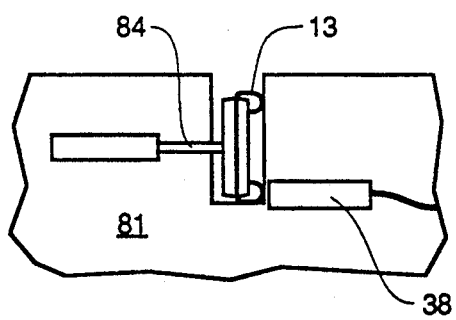
FIG. 9B is a sectional view of the sense track showing an SOJ in the "lead right" position so that leads are "present" to sensor S8.
Figure 9C:
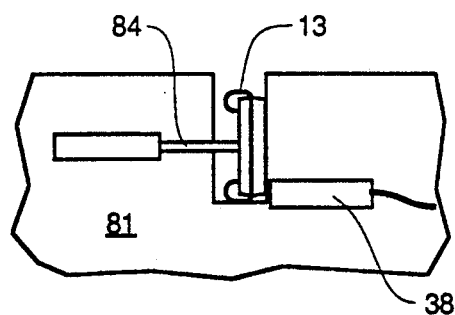
FIG. 9C is a sectional view of the sense track showing an SOJ in the "lead left" position so that leads are "absent" to sensor S8.

Upon signal from sensor 35B that the slide shuttle 65 has reached the extended position, the vertical rotator 71 is actuated to rotate the tube 11 and, thus, elevate the upstream end of the tube beyond the angle of repose of the workpieces 12 within and discharge its contents. The motor 71 is preset to stop after about 35 rotation at a point abutting the upper shuttle stop 72. In that position, the contents discharge from the tube 11 and flow into the sense track 80 to the pre-extended part stop 83. Reference FIG. 9.

The IC 12 have been loaded into the supply tubes 11 in such a way that at this point they can only be oriented with the desired end heading downstream and with the leaded or bottom side facing either all left, away from lead sensor 38, or all right, toward the lead sensor 38, consistently throughout the tube. On signal of sensor 37 that parts are present in the sense track 80, the process of sensing of the orientation of the parts will be initiated. The controller 10 will cause the pressure finger 84 to extend, pushing the part present there against the lead orientation sensor 38. Sensor 38 is an inductive proximity sensor capable of detecting metal at only a very short range. The Square D model PJA111P is such a sensor. In the embodiment of the invention intended for processing leaded IC such as the SOJ, it is necessary that the range of the sensor be short enough, 1 mm±, to detect or not detect a lead 13 extending from the body of the IC at 90°. It is fundamentally necessary that the range not be so long that it detects the lead frame within the body of the IC because detection of metal there is not indicative of orientation. Hence, the pressure finger 84 is used to push the part 12 against the sensor 38 to allow accurate short-range sensing. Refer to Detail A, FIG. 9.

Another embodiment of the inventive method might employ another type of sensor. For example, a vision system could effectively distinguish whether leads 13 are present and, further, a visual system could make that distinction through a transparent tube without discharging the workpieces within. The preferred and described embodiment of sensing workpieces outside the tube offers simplicity, reliability, and relatively low cost but many derivatives of the basic method are obviously possible.

Figure 1A:
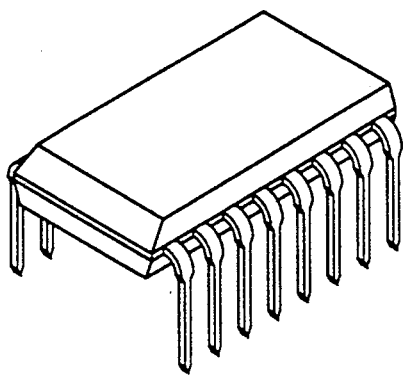
FIG. 1A is a view of a "dual in-line", DIP, package.
Figure 1B:
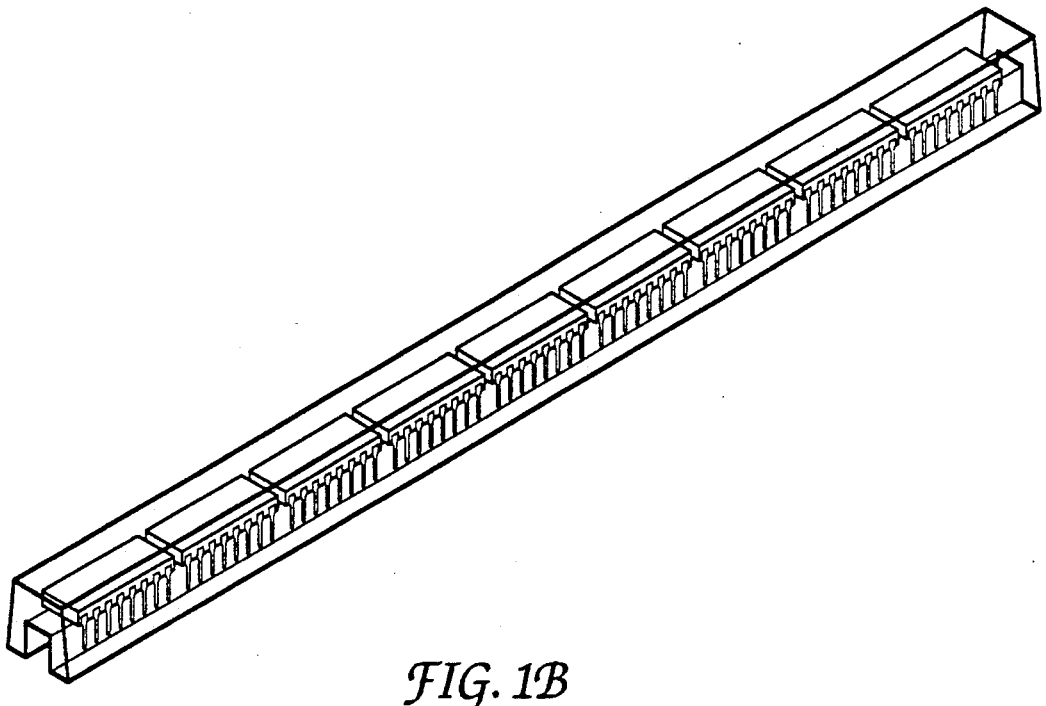
FIG. 1B is a view of an A-tube containing DIP packages.

The preceding described embodiment is specific to IC with metal leads 13 which extend at right angles from the plane of the lead frame. The SOJ (refer FIG. 2A), PLCC, and, potentially, the DIP (refer FIG. 1a) are well suited for such sensing. The DIP, however, is not well suited to other aspects of this embodiment because the DIP chips have longer, fragile leads and require asymmetrical supply tubes. It is obvious that DIPs could be processed by the inventive apparatus with the adoption of a rectangular A-tube, possible modification of the part orientation sensor to read whether leads 13 are oriented up or down rather than left or right, modification within the sort block 90 of the part track 91, and possible modification of the sort block to rotate parts 180°. Similarly, the inventive apparatus could obviously be adapted to accommodate SIP and ZIP chips. Other chips such as the LCC would require only modification of the orientation sensing method; possibly employment of a marker created during manufacture specifically to enable orientation sensing.

Figure 10A:
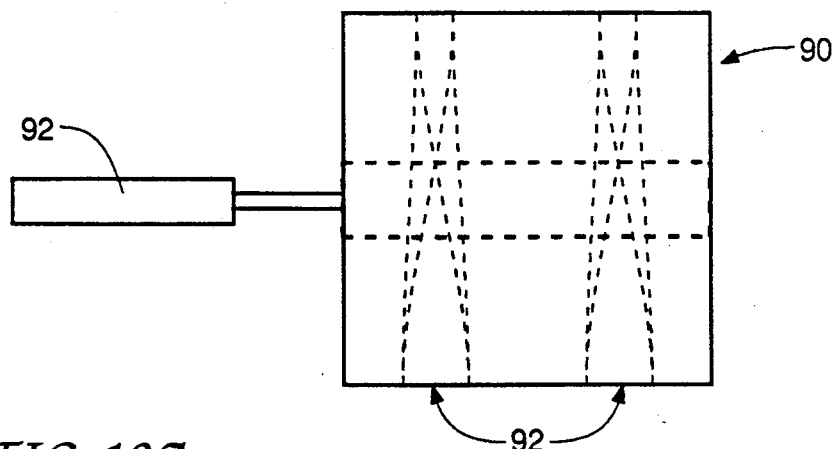
FIG. 10A is a plan view of the sort block. Hidden lines show the two geometrically shaped voids.
Figure 10B:
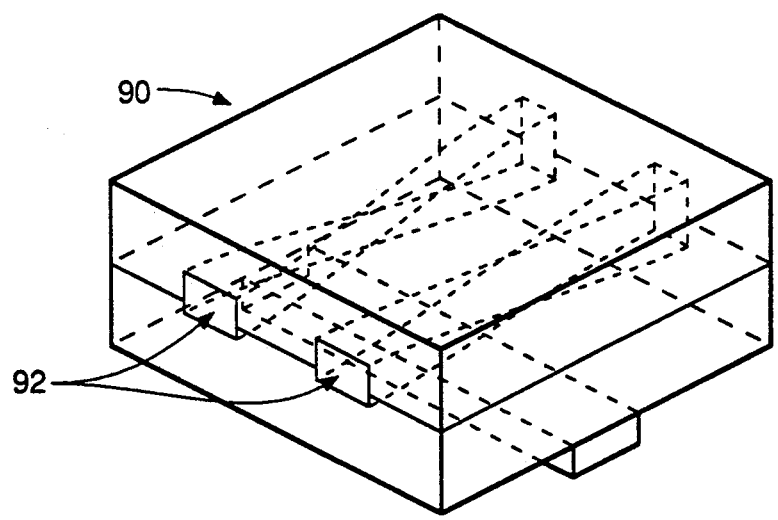
FIG. 10B is an isometric view of the sort block. Hidden lines show the left geometrically void configured to roll a workpiece 90° in a clockwise direction from an on edge, narrow axis position to a flat, wide axis position. The right void is shown by hidden lines in a configuration to roll a workpiece 90° in a counterclockwise direction from an on edge, narrow axis position to a flat, wide axis position.

Upon the sensor 38 determination of whether leads 13 are present or not, the controller 10 will cause the sort block 90 to be moved to one of two positions by activating another pneumatic cylinder 91. As shown in FIGS. 10A and 10B, the sort block 90 is manufactured to contain two geometrically shaped voids 92; each configured to change the orientation of an IC 12 which falls through it. The voids 92 are sufficiently larger than the IC 12 to allow them to stream freely through but not so large that the IC might tumble from the designed course. The method requires generally helical voids; shaped as necessary to accommodate the workpiece. The voids of the SOJ/PLCC embodiment are helical sections which begin at the upstream end as a rectangular void with the major axis being vertical and then incrementally turning 90°, one void rotating left and the other rotating right, to terminate at the downstream end with the major axis of the rectangle being horizontal. Thus, the IC 12 are reoriented from a sideways position facing either left or right to the same flat position. Obviously, another embodiment could use a 180° helical section to invert a part; in which case the alternative channel would be a straight pass. This ability to manipulate a symmetrical supply tube 11 to one of its two narrow-side positions, sense the contents out of the tube, and turn the contents from one of two positions to the desired position is the essence of the invention.

After the sort block 90 is moved to receive the particular orientation of the IC 12, the controller 10 will check sensor 40 to learn if the downstream track 95 is clear to receive the impending stream of parts. Upon a "clear" signal, the pressure finger 84 is retracted and then the parts stop 83 is retracted releasing a tube load of properly aligned parts to the track 95 (refer FIG. 7) and whatever awaits downstream.

Upon a signal from sensor 36 that the sense track 82 is clear, the shuttle 60 will commence a sequence of rapidly retracting to horizontal and bumping the bottom stopper 72, rotating back up to bump the upper stopper 73, and repeating this motion to jar parts 12 from the tube 11 before it is discarded. After a series of bumps, the grip cam 63 is retracted and the tube 11 is ejected into the spent tube bin 98. The shuttle 60 will return to the horizontal position and be retracted to the "home" "position. Upon signal from sensor 35A that the shuttle 60 is in its retracted position, the controller 10 will restart and repeat the entire process.

We claim:
1. A method for automated handling of symmetrical supply tubes and sorting the workpieces within said tubes to a desired, predetermined position, comprising:
   a. a gravity bin for receiving and retaining said tubes in downstream-end-open position with means for mechanically and gravitationally urging tubes downward;
   b. a singulation reservoir for receiving and stacking said tubes on one of two narrow sides;
   c. singulating said tubes;
   d. releasably gripping and moving said singulated tube to a position where workpieces contained within said tube may be sensed as to their orientation and discharged from said tube;
   e. restraining said workpieces upon discharge from said tube;
   f. sensing a representative workpiece and determining which of two possible orientations it is in; and
   g. reorienting said workpieces to a predetermined position bypassing them through one of two geometrically shaped voids selected on the basis of the workpiece orientation sensing, wherein the orien- tation of the workpieces is determined by sensing of a representative workpiece within said singulated tube by a sensing device operating through said tube which tube is transparent to the sensing device.

2. A method as recited in claim 1 wherein singulation is achieved by friction wheels working in cooperation with at least one sensor in such a way that said friction wheels continue to turn and move a tube until it alone is released and, thus, singulated without regard to or dependence upon the wide width cross-sectional dimension of said tube.

3. A method as recited in claim 1 wherein said workpieces contained within the supply tube are semiconductor integrated circuit packages (IC).

4. A method as recited in claim 1 wherein the width of said singulation reservoir is readily adjustable to accommodate supply tubes of various narrow-width cross-sectional dimensions.

5. A method as recited in claim 1 wherein the workpieces contained within the supply tubes are of the same alignment and orientation as each other throughout any single tube such that the downstream-end of all the workpieces is the same as the open downstream-end of the supply tube.

6. A method as recited in claim 1 wherein supply tubes, and workpieces within said supply tubes, upon stacking in the singulation reservoir can be located in only one of two possible positions.

7. A method as recited in claim 1 wherein the workpieces within said singulated tube, having been manipulated to be in one of two positions and determined to be in one rather than the other of the two positions, are passed through the appropriate one of two geometrically shaped voids of a sort block within which the contents are rolled and discharged into the desired, predetermined position.

8. A method for reorienting workpieces within a supply tube to a predetermined position as in claim 1, further comprising:
a. sensing the orientation of a workpiece known to be in one of two positions 180° roll apart;
b. providing a sort block wherein two geometrically shaped voids exist and cooperate to rotate a workpiece passed through the appropriate one of the two voids to the desired, predetermined position; and
c. moving the sort block to accommodate entry of the workpieces into the appropriate one of the two geometrically shaped void based upon the determination of the sensor.

9. A method for reorienting workpieces within a supply tube to a predetermined position as in claim 1, wherein the two geometrically shaped voids are in the form of a 90° helix section, one void turning in a clockwise direction and the other turning in a counter-clockwise direction, such that a workpiece passed through the void will be turned 90° to the right or left as a result of passage through one or the other of the shaped voids.

10. A method for reorienting workpieces within a supply tube to a predetermined position as in claim 1, wherein the difference in the degree of roll imparted to a workpiece between the two geometrically shaped voids is 180°.

11. A machine for automated handling of symmetrical supply tubes and sorting the workpieces within said tubes to a desired, predetermined position, comprising:

a. a gravity bin for receiving and retaining said tubes in downstream-end-open position with means for mechanically and gravitationally urging tubes downward;
b. an adjustable-width singulation reservoir for receiving and stacking said tubes on one of two narrow sides;
c. means for singulating said tubes;
d. means for releasably ripping and moving said singulated tube to a position where workpieces contained within said tube may be sensed as to their orientation and discharged from said tube;
e. means for restraining said workpieces upon discharge from said tube;
f. means for sensing a representative workpiece and determining which of two possible orientations it is in, said means consisting of a sensing device for sensing a representative workpiece within said singulated tube by a sensing device operating through said tube when the tube is transparent to the sensing device;
g. means for reorienting said workpieces to a predetermined position bypassing them through one of two geometrically shaped voids selected on the basis of the workpiece orientation sensing; and
h. means for sensing and controlling the operation of the above machine components.

12. A machine as recited in claim 11, further comprising:
friction wheels working in cooperation with at least one sensor in such a way that said friction wheels continue to turn and move a tube until it alone is released, where in singulation is achieved by said friction wheels and, thus, the workpieces are singulated without regard to or dependence upon the wide width cross-sectional dimension of said tube.

13. A machine as recited in claim 11 wherein said workpieces contained within the supply tube are semiconductor integrated circuit packages (IC).

14. A machine as recited in claim 12 wherein the width of said singulation reservoir is readily adjustable to accommodate supply tubes of various narrow-width cross-sectional dimensions.

15. A machine for reorienting workpieces within a supply tube to a predetermined position as in claim 12, further comprising:
a. the means for sensing the orientation of a workpiece known to be in one of two positions 180° roll apart;
b. a sort block wherein said two geometrically shaped voids exist and cooperate to rotate a workpiece passed through the appropriate one of the two voids to the desired, predetermined position; and
c. means to move the sort block to accommodate entry of the workpieces into the appropriate one of the two geometrically shaped void based upon the determination of the sensor.

16. A machine for reorienting workpieces within a supply tube to a predetermined position as in claim 12, wherein the two geometrically shaped voids are in the form of a 90° helix section, one void turning in a clockwise direction and the other turning in a counter-clockwise direction, such that a workpiece passed through the void will be turned 90° to the right or left as a result of passage through one or the other of the shaped voids.

17. A machine for reorienting workpieces within a supply tube to a predetermined position as in claim 12, wherein the difference in the degree of roll imparted to a workpiece between the two geometrically shaped voids is 180°.

18. A method for automated handling of symmetrical supply tubes and sorting the workpieces within said tubes to a desired, predetermined position, comprising:
   a. gravity bin for receiving and retaining said tubes in downstream-end-open position with means for mechanically and gravitationally urging tubes downward;
   b. a singulation reservoir for receiving and stacking said tubes on one of two narrow sides;
   c. singulating said tubes;
   d. releasably gripping and moving said singulated tube to a position where workpieces contained within said tube may be sensed as to their orientation and discharged from said tube;
   e. restraining said workpieces upon discharge from said tube;
   f. sensing a representative workpiece and determining which of two possible orientations it is in, wherein a representative workpiece is discharge from said singulated tube and the orientation of said workpiece is sensed outside the tube; and
   g. reorienting said workpieces to a predetermined position by passing them through one of two geometrically shaped voids selected on the basis of the workpiece orientation sensing,
   wherein said workpieces discharged from said singulated tube and sensed outside the tube are semiconductor integrated circuit packages (ICs), and the orientation of the (ICs) are determined by sensing the presence or absence of metal leads of said IC.

19. A method as recited in claim 18 wherein singulation is achieved by friction wheels working in cooperation with at least one sensor in such a way that said friction wheels continue to turn and move a tube until it alone is released and, thus, singulated without regard to or dependence upon the wide width cross-sectional dimension of said tube.

20. A method as recited in claim 18 wherein said step of releasably gripping and moving of a singulated supply tube includes agitating said supply tube to clear it of remaining semiconductor integrated circuit packages as an intrinsic function of the apparatus without additional means.

21. A method as recited in claim 18 wherein the width of said singulation reservoir is readily adjustable to accommodate supply tubes of various narrow-width cross-sectional dimensions.

22. A method as recited in claim 18 wherein the workpieces contained within the supply tubes are of the same alignment and orientation as each other throughout any single tube such that the downstream-end of all the workpieces is the same as the open downstream-end of the supply tube.

23. A method as recited in claim 18 wherein the supply tubes, and workpieces within said supply tubes, upon stacking in the singulation reservoir can be located in only one of two possible positions.

24. A method as recited in claim 18 wherein the workpieces within said singulated tube, having been manipulated to be in one of two positions and determined to be in one rather than the other of the two positions, are passed through the appropriate one of two geometrically shaped voids of a sort block within which the contents are rolled and discharged into the desired, predetermined position.

25. A method for reorienting workpieces within a supply tube to a predetermined position as in claim 18, further comprising:
   a. sensing the orientation of a workpiece known to be in one of two positions 180° roll apart;
   b. providing a sort block wherein two geometrically shaped voids exist and cooperate to rotate a workpiece passed through the appropriate one of the two voids to the desired, predetermined position; and
   c. moving the sort block to accommodate entry of the workpieces into the appropriate one of the two geometrically shaped void based upon the determination of the sensor.

26. A method for reorienting workpieces within a supply tube to a predetermined position as in claim 18, wherein the two geometrically shaped voids are in the form of a 90° helix section, one void turning in a clockwise direction and the other turning in a counter-clockwise direction, such that a workpiece passed through the void will be turned 90° to the right or left as a result of passage through one or the other of the shaped voids.

27. A method for reorienting workpieces within a supply tube to a predetermined position as in claim 18, wherein the difference in the degree of roll imparted to a workpiece between the two geometrically shaped voids is 180°.

28. A machine for automated handling of symmetrical supply tubes and sorting the workpieces within said tubes to a desired, predetermined position, comprising:
   a. a gravity bin for receiving and retaining said tubes in downstream-end-open position with means for mechanically and gravitationally urging tubes downward;
   b. an adjustable-width singulation reservoir for receiving and stacking said tubes on one of two narrow sides;
   c. means for singulating said tubes;
   d. means for releasably gripping and moving said singulated tube to a position where workpieces contained within said tube may be sensed as to their orientation and discharged from said tube;
   means for restraining said workpieces upon discharge from said tube;
   f. means for sensing a representative workpiece and determining which of two possible orientations it is in, wherein a representative workpiece is discharged from one of said tubes after said tube is singulated, and the orientation of said workpiece is sensed outside the tube;
   g. means for reorienting said workpieces to a predetermined position by passing them through one of two geometrically shaped voids selected on the basis of the workpiece orientation sensing; and
   h. means for sensing and controlling the operation of the above machine components,
   friction wheels working in cooperation with at least one sensor in such a way that said friction wheels continue to turn and move a tube until it alone is released, wherein singulation is achieved by said friction wheels and, thus, the workpieces are singulated without regard to or dependence upon the wide width cross-sectional dimension of said tube, wherein said workpieces contained within the supply tube are semiconductor integrated circuit packages (ICs), and the orientation of the ICs are determined by sensing the presence or absence of metal leads of said IC.

29. A machine as recited in claim 28 wherein said workpieces discharged form said tubes after they are singulated and sensed outside the tube are semiconductor integrated circuit packages (IC).

30. A machine as recited in claim 29, further comprising:
means for agitating said tubes after they are singulated wherein said step of releasably gripping and moving of a supply tube includes agitating said supply tube to clear it of remaining semiconductor integrated circuit packages as an intrinsic function of the apparatus without additional means.

31. A machine as recited in claim 28 wherein the width of said singulation reservoir is readily adjustable to accommodate supply tubes of various narrow-width cross-sectional dimensions.

32. A machine for reorienting workpieces within a supply tube to a predetermined position as in claim 28, further comprising:
 a. the means for sensing the orientation of a workpiece known to be in one of two positions 180° roll apart;
 b. a sort block wherein said two geometrically shaped voids exist and cooperate to rotate a workpiece passed through the appropriate one of the two voids to the desired, predetermined position; and
 c. means to move the sort block to accommodate entry of the workpieces into the appropriate one of ht two geometrically shaped void based upon the determination of the sensor.

33. A machine for reorienting workpieces within a supply tube to a predetermined position as in claim 28, wherein the two geometrically shaped voids are in the form of a 90° helix section, one void turning in a clockwise direction and the other turning in a counter-clockwise direction, such that a workpiece passed through the void will be turned 90° to the right or left as a result of passage through one or the other of the shaped voids.

34. A machine for reorienting workpieces within a supply tube to a predetermined position as in claim 28, wherein the difference in the degree of roll imparted to a workpiece between the two geometrically shaped voids is 180°.

* * * * *